US005814840A

United States Patent [19]

Woodall et al.

[11] Patent Number: 5,814,840

[45] Date of Patent: Sep. 29, 1998

[54] INCANDESCENT LIGHT ENERGY CONVERSION WITH REDUCED INFRARED EMISSION

[75] Inventors: Jerry MacPherson Woodall; Kevin Tyrone Kornegay, both of West Lafayette, Ind.; Michael Gregg Spencer, Washington, D.C.

[73] Assignees: Purdue Research Foundation, West Lafayette, Ind.; Howard University, Washington D.C.

[21] Appl. No.: 469,675

[22] Filed: Jun. 6, 1995

[51] Int. Cl.[6] .................... H01L 33/00

[52] U.S. Cl. .................... 257/103; 257/77; 257/80; 257/102; 313/315; 313/501; 313/499

[58] Field of Search .................... 313/498, 499, 313/501, 315; 257/77, 80, 102, 103

[56] References Cited

U.S. PATENT DOCUMENTS

| | | | |
|---|---|---|---|
| 223,898 | 1/1880 | Edison . | |
| 3,502,930 | 3/1970 | Fok | 313/315 |
| 3,517,281 | 6/1970 | Mlavsky | 257/77 |
| 3,634,149 | 1/1972 | Knippenberg | 257/77 |
| 5,243,204 | 9/1993 | Suzuki et al. | 257/77 |

FOREIGN PATENT DOCUMENTS

| | | | |
|---|---|---|---|
| 5-48145 | 2/1993 | Japan | 257/77 |

OTHER PUBLICATIONS

Hochberg et al., "A Thin–Film Integrated Incandescent Display", IEEE Transactions on Electron Devices, vol. ED–20, No. 11, Nov. 1973 pp. 1002–1005.

Knippenberg, W.F., "Growth Phenomena in Silicon Carbide" Phillips Research Reports, 1963, pp. 161–274.

*Primary Examiner*—Jerome Jackson

*Attorney, Agent, or Firm*—Woodard, Emhardt, Naughton, Moriarty & McNett

[57] ABSTRACT

Energy conversion among heat or electricity and incandescent light is achieved, in the case of incandescent light emission, with the emission having reduced IR content, using a high band gap semiconductor element that is tailored in structure and in energy conversion physics to suppress free carrier absorption so as to be transparent or reflecting of photon energy that is below the band gap of the semiconductor and to only emit photon energy above the band gap of the semiconductor. A filament of lightly "N" doped 3C-SiC, at about 900 degrees C., will incandesce and radiate in the visible range for energies greater than about 2 eV and will exhibit inefficient emission of photons for energies less than about 2 eV.

27 Claims, 3 Drawing Sheets

INCANDESCENT LIGHT ENERGY CONVERSION WITH REDUCED INFRARED EMISSION

FIELD OF THE INVENTION

The invention is in the field of the conversion of energy among light, heat and electricity, and in particular to the interchangeable conversion of heat or electricity to low infrared (IR) content incandescent light.

BACKGROUND OF THE INVENTION AND RELATION TO THE PRIOR ART

Energy is converted from one form to another, such as from heat or electricity to radiant energy including light, in a variety of applications, including illumination, displays and communications. Heretofore in the art, electroluminescent light, which is accompanied by minimal heat, has been the light source for the densely packed display and communication applications, even though incandescent light contains the most power. Further, heretofore in the art, in applications that involve the interchange of incandescent light energy with electricity and heat, the presence of energy in the infrared (IR) portion of the spectrum has been resulting in the generation of heat that in turn operates to reduce light conversion efficiency and has required added structure to accommodate.

In applications where heat or electricity is converted to incandescent light in a material, very high temperatures have been required which in turn results in the emission of a substantial content of energy in the infrared portion of the spectrum.

In many incandescent light applications the incandescence is the product of straight resistance heating. The material Silicon Carbide (SiC) in doped bulk form, known in the art as "Glow Bars", is used as heating elements. The "Glow Bars" at about 900 degrees C. incandesce with a red-orange color. Among applications involving white light, the Edison light bulb, in U.S. Pat. No. 223,898 employed high resistance, coiled, carbon filaments that glowed white, but Edison had to provide the added structure of an evacuated glass bulb for both environmental and physical shock protection. Later glowing filament type light bulb advances substituted coiled high resistance tungsten for the carbon filaments of Edison. The tungsten glows white and is physically stronger with respect to shock resistance but the environmental protection of the glass bulb is still needed. In an article by Hochberg et al., IEEE Transactions on Electron Devices Vol. ED-20 No. 11 Nov. 1973, P 1002–1005, there is described a densely packed display using a tungsten filament pattern in an evacuated environment, to be operated at 1200 Degrees C.

In the incandescent light applications heretofore in the art the glowing element has had an emission spectral distribution that follows that of the traditional black body which, while it has the highest emission rate for any material, much of the power emitted is in the infrared portion of the spectrum and therefore accompanied by considerable waste. There is a need in the incandescent light energy conversion art to be able to perform the conversion so that infrared (IR) content in the incandescent light emission and the accompanying heat, is reduced.

SUMMARY OF THE INVENTION

Energy conversion among heat or electricity and incandescent light is achieved, with the emission eliminating photon energies below a threshold producing as an example reduced IR content, using a high band gap semiconductor element that is tailored in structure and in energy conversion physics to suppress free carrier absorbtion so as to be transparent or reflecting of photon energy that is below the band gap of the semiconductor and to only emit photons with energy above the band gap of the semiconductor. A filament, such as one of lightly "N" doped 3C-SiC, at about 900 degrees C., will incandesce and radiate in the visible range for energies greater than about 2 eV and will exhibit inefficient emission of photons for energies less than about 2 eV. A good visible emitter is also a good visible collector that will convert light to heat.

DESCRIPTION OF THE INVENTION

In the invention, a high band gap (>2 eV) semiconductor member has its structural and its energy conversion physics interrelatedly tailored to suppress free carrier absorption so as to be transparent or reflecting of photon energy that is below the band gap of the semiconductor and to emit efficiently only photon energy above the band gap of the semiconductor. The emission spectra of the invention provides incandescent light in the visible range with significantly reduced IR content.

In the invention, an incandescent emission element is provided that is in a free standing filament structural form with means to bring the filament to a moderately high, at or above 900 degrees C. temperature. The emission element is a body of a high, (>2 eV) band gap, refractory, semiconductor material that is lightly doped to about $10^{17}$ atoms/cc with an extrinsic conductivity determining impurity at least in a region adjacent an emission surface and which body also has the energy conversion properties altered to suppress free carrier absorption of photon energy below the band gap. The element can convert intense light such as laser light into heat that is not radiated.

The materials, cubic silicon carbide(3C-SiC), having a band gap of about 2.3 eV, hexagonal silicon carbide(α-SiC), having a band gap of about 3 eV; both nitrogen doped to about $10^{17}$ atoms/cc, and the material aluminum nitride (AlN),having a band gap of about 6.1 eV, doped with silicon for "n" type conductivity or with an appropriate acceptor dopant for "p" type conductivity to about $10^{17}$ atoms/cc.; in monocrystalline or polycrystalline form, for example, high band gap refractory semiconductor materials, and when in a thin film structural shape, at temperatures at or above 900, 1300, and 1800 degrees C. respectively, can serve as a low photon energy content incandescent light emitting element.

Figure 1:
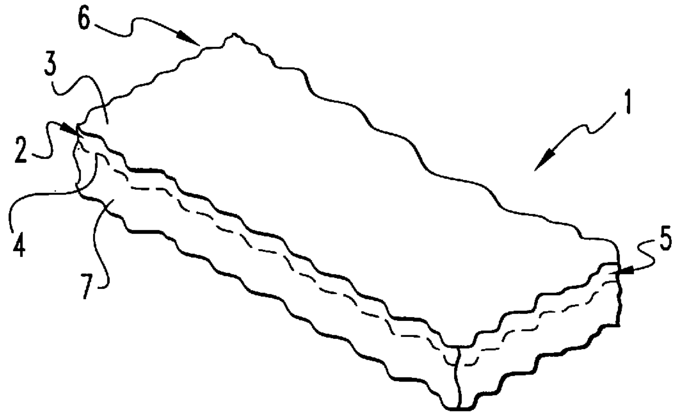
FIG. 1 is a perspective illustration of the incandescent light emitting element of the invention.

The structural features of the low IR content light emitting element of the invention are illustrated in FIG. 1. Referring to FIG. 1, the body 1 is of a high, greater than 2 electron volt (eV) band gap, refractory, semiconductor material. A material is considered refractory when it is resistant to oxidation and is tolerant of temperatures of 1000 degrees C. and above. The body 1 is doped lightly to about $10^{17}$ atoms/cc, in the region 2 adjacent the light emitting surface 3, to a depth illustrated dotted as interface 4. The body 1, further is in essentially free standing incandescent radiation filament form. In this form the filament is heated, such as by passing electric current at least through the region 2 of the body 1 from region 5 to region 6. The filament may also be subjected to direct heating to a temperature of 900 degrees centigrade or higher. In the free standing structural form, loss of heat by conduction through supports is minimized.

At temperatures above 900 degrees C. the body 1 will emit low IR content incandescent light through the surface 3 or convert light with photon energy greater than the band gap impinging on the surface 3 to heat. The doping level of the region 2 is principally to provide resistance (R) for heating power ($I^2R$) to the region 2 when current (I) is passed through it. The thickness dimension between the surface 3 and the interface 4 is involved in the suppression of the total number of free carriers (electrons and holes) that are formed in the region 2. The supression of free carriers can also be controlled by selective doping of the region 7 beyond the interface 4 to move the Fermi level in the region 7 to an energy level that operates to prevent the formation of undesired free carriers.

Figure 2:
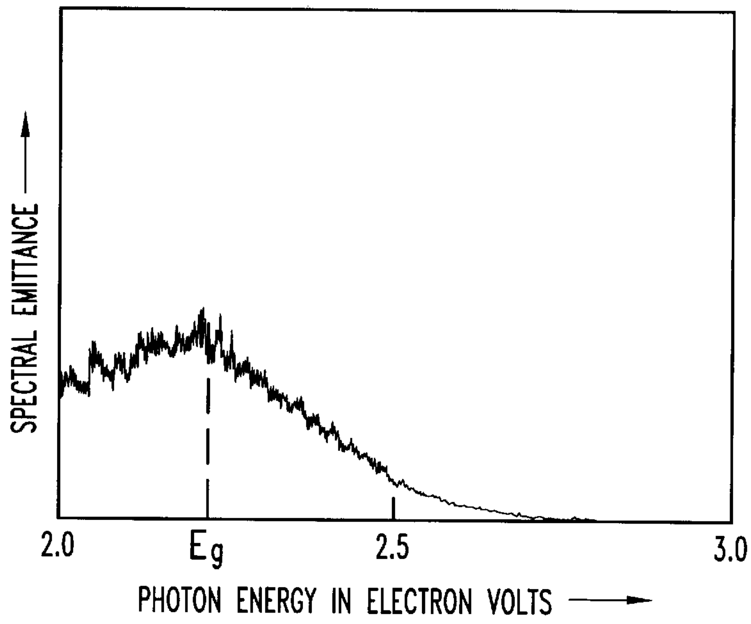
FIG. 2 is a graph of the emission spectrum of the low IR incandescent light emitting element of the invention.

In FIG. 2 there is illustrated the emission spectrum of the low IR content incandescent light emitting element of the invention for an example material 3C-SiC. Referring to FIG. 2, the intensity of the emission decreases below the band gap energy value illustrating the lower IR content light emitted in accordance with the invention.

Figure 3:
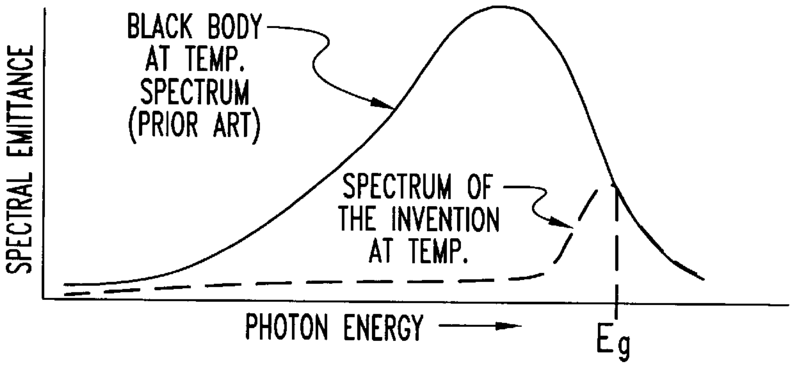
FIG. 3 is a graph showing the idealized relationship of the emittance spectrum of the invention compared with that of a standard slack body.

In FIG. 3 there is illustrated the idealized relationship of the emittance of the invention to that of a standard black body, at a temperature (Temp), the emittance of which black body has a substantial portion of the spectrum in the IR range. Referring to FIG. 3, the curve illustrates that the IR portion of the emittance of the invention is small. Since luminosity of an incandescent light source is defined in the art as the ratio of total radiation in the visible spectrum to heat contained in the radiant energy spectrum, the invention clearly provides high luminosity and a superior light source.

Figure 4:
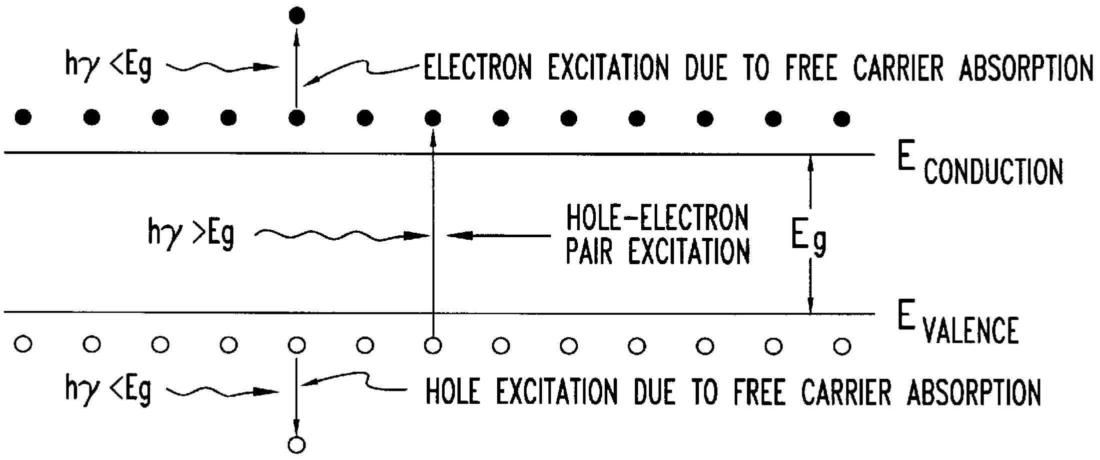
Fig. 4 (PRIOR ART)
FIG. 4 is a band energy diagram of the light responsiveness of a prior a conventional semiconductor illustrating the effect of free carrier absorbtion.
Figure 5:
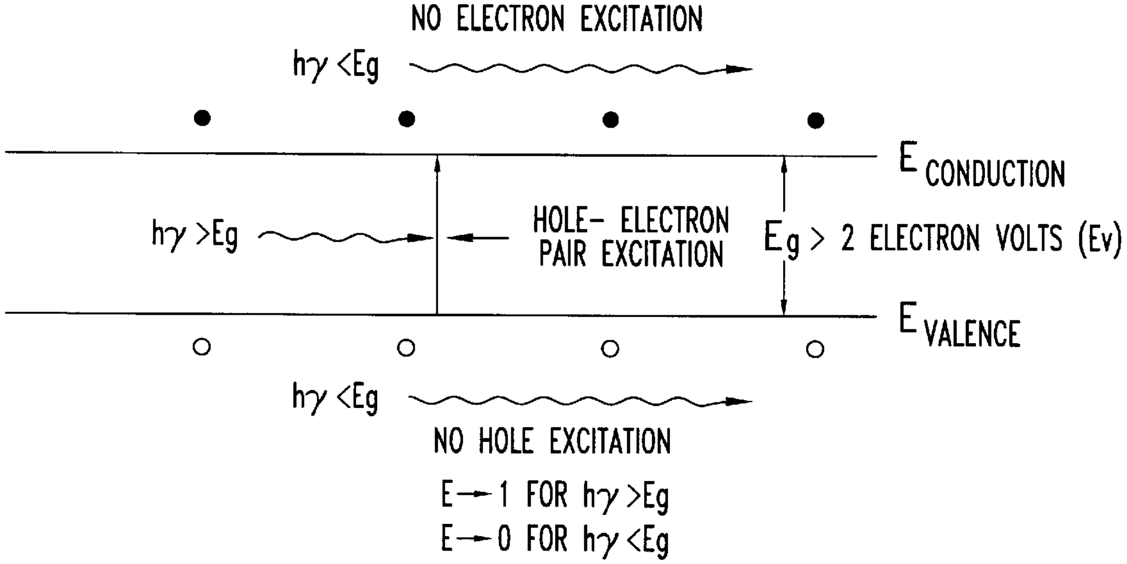
FIG. 5 is a band energy diagram illustrating the light responsiveness of the invention.

The principles of the invention are further illustrated in connection with a comparison between band energy diagrams. In FIG. 4 there is shown the light responsiveness of a prior art conventional semiconductor illustrating the black body nature of a semiconductor with sufficient charge carriers to cause free carrier absorption and with an emissivity (E) approaching 1 for all photon energies. In FIG. 5 there is shown the light responsiveness of the invention illustrating the selective absorption and emission properties such that emissivity (E) approaches 1 for light energy (hν) greater than the band gap (hν>Eg) and emissivity (E) approaches 0 for light energy (hν) less than the band gap (hν<Eg).

Referring to FIG. 4, the valence band energy level, labelled "E valence" has the symbol "○" for hole type carriers adjacent thereto and the conduction band energy level labelled "E conduction" has the symbol "○" for electron type carriers adjacent thereto. The band gap (Eg) of the material is the energy separation between the valence and conduction bands. Where the light energy hν is less than the band gap energy (hν<Eg),the light energy is strongly absorbed in a process known as free carrier absorption, where free electrons and free holes are excited by the light which, on recombination, transfer energy to the body of the material, with resultant IR emission. Where the light energy hν is greater than the band gap energy (hν>Eg), a large, greater than bandgap absorption causes hole-electron pair excitation. At sufficiently high temperatures this can result in emission of light with photon energy greater than the band gap. Referring to FIG. 5, the material of the invention has a high, greater than 2 electron volts (>2 eV) band gap separation (Eg). The material has fewer electrons and holes so that for light energy less than the band gap (h<Eq) there is no significant electron or hole excitation, hence suppressed free carrier absorption, and hence suppressed IR emission. For light energy greater than the band gap (hν>Eg), the light energy is strongly absorbed via hole—electron pair generation. At sufficiently high temperatures this can result in emission of light with photon energy greater than the band gap.

The light responsiveness of materials is in accordance with the following. Absorptance (A) is the property that determines the fraction of incident radiation that is absorbed. Reflectance (R) is the property that determines the fraction of incident radiation that is reflected. Transmittance (T) is the property that determines the fraction of incident radiation that passes through a material. Each of the properties can vary from 0 to 1 but the sum of A, R, and T equal 1. Emissivity (E) is equal to (A) which is equal to 1-(R+T), and further it is equal to the rate of radiant energy emission per unit area divided by the rate of emission of a black body material for which (A) is 1. For a given temperature a black body has the highest emission rate for any material. Materials with a Eg>0 band gap energy, including semiconducting materials, are heated to a maximum temperature, either by radiant energy, conduction, convection or by electric current. The maximum temperature is such that either the intrinsic or extrinsic carrier concentration is insufficient to cause a significant amount of free carrier adsorbtion of photons with energies less than the band gap energy. For photon energies above the band gap energy, this material will have an A and hence E approaching 1−R. For this condition, R can be made to approach 0 and E will then approach 1. For photons with energies less than the band gap energy E will approach 0.

In accordance with the invention, materials where E approaches 1 for photon energies greater than the band gap (hν>Eg) and where E approaches 0 for photon energies less than the band gap (hν<Eg), when heated to sufficient temperature will efficiently emit photons with energies above the band gap energy and will behave like a black body for those energies. Further, those materials of the invention, will inefficiently emit photons with energies below the band gap energy, and will behave like a good reflector or a good transparent material for those energies. Therefore, as illustrated in FIG. 3 the materials of this invention will have a spectral distribution of emitted radiation which is black body like for energies above the band gap energy and a greatly attenuated black body spectral distribution for energies less than the band gap.

Still further, in accordance with the invention, when the material is a high, >2 eV, band gap semiconductor, tailored to suppress free carrier absorption and heated to 900 degrees C. or above a new type of incandescence results. The incandescence reported for glowing filament standard light bulbs has had a spectral distribution similar to that of the prior art black body shown in FIG. 3 where most of the power emitted is in the infra red portion of the spectrum and is wasted for high high visible light emission applications. The incandescence of the invention provides a greatly suppressed infra red emission and hence will have a greatly increased luminosity which is the ratio of the radiation in the visible with respect to radiation rate of the heat IR portion of the spectrum.

The incandescent elements of the invention as illustrated in FIG. 1 are free standing filamentary in shape with provision for heating either by passing an electric current through the filament or from an external heating source. Loss of heat by conduction through supports is minimized by the free standing structure.

BEST MODE OF CARRYING OUT THE INVENTION

The preferred embodiment for the incandescent element is fabrication in the beta or cubic form of the semiconductor material silicon carbide(3C-SiC), which has the beneficial attributes of being strong, stable at high temperature susceptible to modification of it's radiation in the IR part of the spectrum and able to be grown on cheap and easily removed substrates. The elements can be fabricated in a multitude of shapes and geometry for use in all illumination and communication applications. The 3C-SiC has an indirect room temperature band gap (Eg) of 2.3 eV and therefore band to band absorption of radiation commences for photon energies above 2.3 eV. As the temperature increases Eg decreases thereby shifting the photon energies at which band to band absorption begins to smaller energies. For a material that is weakly absorbing, the emission spectrum of incandescent radiation follows the relationship of Equation 1.

$$K(h\nu)X\phi(h\nu),T) \qquad \text{Equation 1.}$$

where:

$\phi$ is the normal radiation from a black body

K is the optical absorption coefficient of SiC at that wavelength

X is the thickness of the material

By suppressing the absorption of radiation energy below 2.3 eV, in accordance with the invention, incandescent radiation is produced that contains significantly less infrared. In this embodiment the supression of the below 2.3 eV absorption is accomplished by the use of boron doping in the layer 7 of FIG. 1, to about $10^{15}$ atoms/cc, which causes the Fermi level to be pinned at about 0.4 eV above the valence band producing a high resistivity material, and thereby minimizing the free carrier absorption. The conductive, nitrogen doped layer 2 in FIG. 1, is kept thin for the same reasons. By the combination of a relatively thick structural layer 7 that has essentially no free carriers and a thin highly conductive layer 2, an ideal incandescent structure can be realized.

Figure 6:
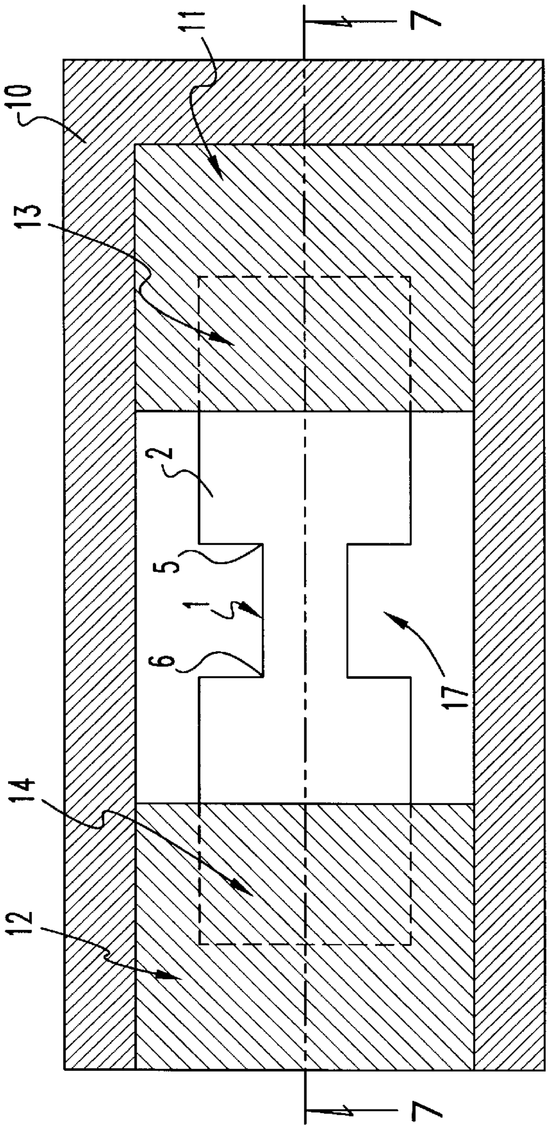
FIG. 6 is a top view of a preferred embodiment of the invention employing 3C-SiC material.
Figure 7:
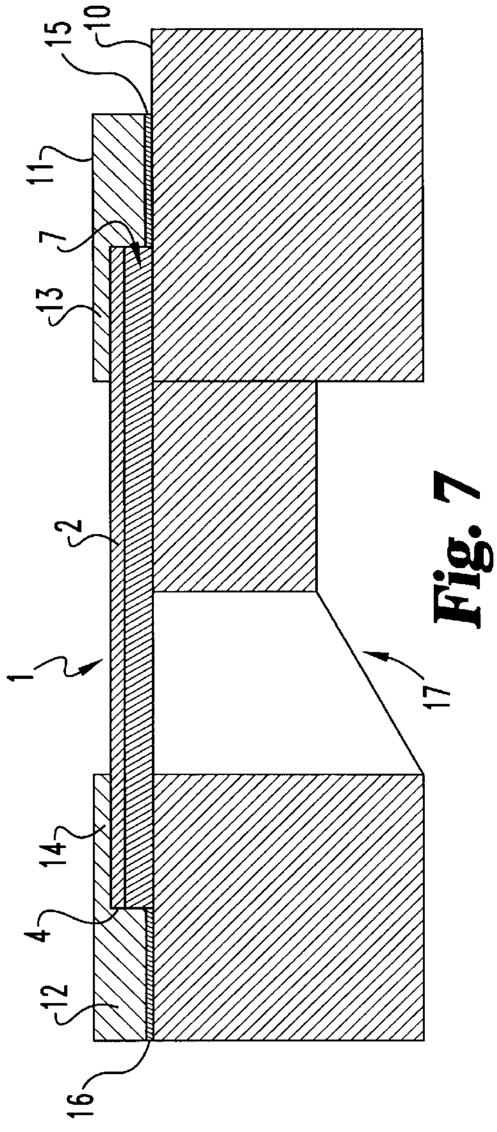
FIG. 7 is side view of the embodiment of FIG. 6.

The simplest free standing filamentary element and the fabrication technique involved, using the same reference numerals as in FIG. 1 where appropriate, is described and illustrated in connection with FIGS. 6 and 7; in which FIG. 6 is a top view of and FIG. 7 is side view along the line 7—7 of FIGS.

Referring to FIGS. 6 and 7, a 3C-SiC boron doped epitaxial layer 7 is grown on a Si substrate 10 to a thickness of approximately 10 micrometers followed, on interface 4, with a 500–1000 Angstrom thick layer 2 of nitrogen doped SiC with the portion 1 to be corresponding, on removal of the portion of the substrate 10 under it to the filament 1 of FIG. 1.

The growth of silicon carbide on silicon uses standard techniques reported in the literature and in essence is accomplished by loading a cleaned silicon wafer into a chemical vapor deposition reactor. Any oxide is removed from the wafer by thermal treatment in excess of 1000 degrees C. The silicon wafer is brought to a temperature of about 1400 degrees C. in a gas stream of propane, which forms a thin skin or buffer layer of silicon carbide on the surface of the silicon wafer. The temperature is then lowered to about 1350 degrees C. and epitaxial growth of silicon carbide on the silicon carbide buffer layer is performed and continued to the layer thicknesses desired. The growth uses three gasses; hydrogen, propane and silane. The hydrogen to silane ratio is about 1000 to 1 and the silane to propane ratio is about 3 to 1. In the layer 7, boron doping is accomplished by adding boron trifluoride to the gas stream. In the layer 2, nitrogen doping is accomplished by using ammonia. Growth rates up to 3 micrometers per hour can be obtained. Using standard lithographic techniques an etching mask of photoresist the shape of the desired filament and contact area is placed on the epitaxial layers and the shape of the filament 1, with the edges 5 and 6 corresponding to the faces 5 and 6 of FIG. 1 is etched out of the layers 2 and 7 using for example plasma etching with sulfur hexafluoride ($SF_6$) gas. Using levels of deposition masking, regions for insulation areas 11 and 12 and subsequently for contacts 13 and 14 are defined. The insulation layers 15 and 16 of silicon dioxide ($SiO_2$ ) are deposited on the substrate 10, followed by the masking and deposition of nickel (Ni) ohmic contacts 13 and 14 to the filament 1. The insulation areas 15 and 16 are to thermally isolate the to be heated region of the filament 1 as much as possible to minimize heat transfer by conduction. The ohmic contacts 13 and 14 are annealed in an inert environment at about 1000 degrees C. After annealing of the contacts 13 and 14, a layer of etch masking is provided to permit etching away of the silicon substrate 10 in the region 17, to allow the filament 1 to become free standing. The etching is performed in a dilute solution of hydrofluoric acid (HF). For high temperature passivation the filament is coated with about 100 Angstroms of aluminum nitride (AlN) which is nominally lattice matched to SiC and which at high temperature renders the filament 1 essentially impervious to oxidation in air at high temperatures.

The final device is mounted on a support and provided with a cover, if needed and standard wires, not shown, are attached to the contacts 13 and 14 to supply sufficient electrical current from a standard source, not shown, to bring the resistive load, the layer 2 of the filament 1 between the faces 5 and 6 to 900 degrees C. or above.

What has been described is a structural principle in the interchangeable conversion of electric current or heat to incandescent light.

What is claimed is:

1. Apparatus for the conversion of energy between at least one of heat and electricity and incandescent light comprising in combination:

a semiconductor energy converter body member having a semiconductor body, with at least one radiant energy transfer surface and at least a first region for the transfer of at least one of heat and electricity, said first region including at least a first end and a second end, said first region extending between said first end and said second end, said semiconductor energy converter body member having a band gap greater than about 2 eV, said semiconductor energy converter body having at least a second layer adjacent to and essentially parallel with said first region in which the free carrier absorption property of said semiconductor is suppressed, said second layer including at least a first end and a second end adjacent said first end and said second end of said first layer, respectively, said second layer separated from said first region by an interface, and, means transferring at least one of heat and electricity at least to said first region, wherein said means transferring at least one of heat and electricity includes at least one of: (1) electrical contacts in contact with both said first end and said second end of said first region, for current to pass therebetween, (2) electrical contacts in contact with both said first end and said second end of said second layer, for current to pass therebetween and (3) an external heating source for heating said semiconductor body to cause incandescent light to be emitted by said radiant energy transfer surface.

2. The apparatus of claim 1 wherein at least said first region is doped for electric current produced heating.

3. The apparatus of claim 1 wherein said semiconductor body is of a material taken from the group of cubic silicon carbide (3C-SiC), hexagonal silicon carbide (SiC) and aluminum nitride (AlN).

4. The apparatus of claim 2 wherein said semiconductor body is of a material taken from the group of cubic silicon carbide (3C-SiC), hexagonal silicon carbide (αSiC) and aluminum nitride (AlN).

5. The apparatus of claim 4 wherein said means transferring at least one of heat and electricity is the passing of electric current through said layer.

6. The apparatus of claim 5 wherein said semiconductor energy converter body has a first thin layer adjacent said radiant energy transfer surface, said thin layer being supported by a thicker structural support layer.

7. The apparatus of claim 6 wherein said semiconductor energy converter body member is coated with a layer of aluminum nitride (AlN).

8. Incandescent light emission apparatus comprising in combination:

an energy conversion body member including at least one radiant energy emission surface, and additionally including at least a first region including said at least one radiant energy emission surface, said first region including at least a first end and a second end, said first region extending between said first end and said second end, and at least a second region having different properties from said first region, said second region being adjacent to said first region, said second region including at least a first end and a second end, said second region extending between said first end and said second end, said first end of said first region adjacent said first end of said second region and said second end of said first region adjacent said second end of said second region, at least said second region of said body member being adapted to suppress light energy in the infra red spectrum range emitted through said radiant energy emission surface, and means applying to said body at least one of heat and electricity operable to produce emission through said radiant energy emission surface, wherein said means applying to said body at least one of heat and electricity includes at least one of: (1) electrical contacts in contact with both said first end and said second end of said first region, for current to pass therebetween, (2) electrical contacts in contact with both said first end and said second end of said second layer, for current to pass therebetween, and (3) an external heating source for heating said semiconductor body to cause incandescent light to be emitted by said radiant energy emission surface.

9. The incandescent light emission apparatus of claim 4 wherein said energy conversion body member is a semiconductor and said adaptation to suppress light energy in the infra red spectrum is the supression of free carrier generation in said semiconductor.

10. The incandescent light emission apparatus of claim 9 wherein said semiconductor body is of a material taken from the group of cubic silicon carbide (3C-SiC), hexagonal silicon carbide (αSiC) and aluminum nitride (AlN).

11. The apparatus of claim 10 wherein said layer adjacent said radiant energy transfer surface is doped for electric current produced heating.

12. The apparatus of claim 11 wherein said means applying at least one of heat and electricity is the passing of electric current through said layer.

13. The apparatus of claim 12 wherein said semiconductor energy converter body has a first thin layer adjacent said radiant energy transfer surface, said thin layer being supported by a thicker structural support layer.

14. Incandescent light emission apparatus comprising in combination:

a semiconductor body of a material taken from the group of semiconductors having a band gap greater than about 2 eV, said body having at least one radiant energy transfer surface, said body having at least at least a first thin lightly doped layer adjacent said energy transfer surface adapted for suppression of the free carrier absorption property, said body additionally including at least a second doped layer adjacent said first layer, said second layer distal from said energy transfer surface, said first layer being doped more heavily than said second layer, said second layer additionally adapted for suppression of the free carrier absorption property, wherein said first thin lightly doped layer adjacent said energy transfer surface includes first and second opposing surfaces substantially in parallel with each other, said energy transfer surface extending between said first and second opposing surfaces and perpendicular to said first and second opposing surfaces, wherein said second doped layer adjacent said first layer includes first and second opposing surfaces substantially in parallel with each other, said second doped layer extending between said first and second opposing surfaces, said first opposing surface of said first layer adjacent said first opposing surface of said second layer and said second opposing surface of said second layer adjacent said second opposing surface of said second layer, means heating at least said first layer sufficient to produce incandescent emission through said transfer surface, said means including at least first and second electrical contacts in electrical contact with at least one of either: (1) both said first and said second opposing faces of said first layer, for current to pass therebetween, and (2) both said first and said second opposing faces of said second layer, for current to pass therebetween.

15. The apparatus of claim 14 wherein said means heating said layer includes passing electric current through said layer.

16. The apparatus of claim 15 wherein said semiconductor body is of a material taken from the group of cubic silicon carbide (3C-SiC), hexagonal silicon carbide (αSiC) and aluminum nitride (AlN).

17. The incandescent light emission apparatus of claim 16, wherein said semiconductor body is coated with a layer of aluminum nitride (AlN).

18. Incandescent light emission apparatus comprising in combination: a semiconductor body of a material taken from the group of semiconductors having a band gap greater than 2 eV, said body having at least one radiant energy transfer surface, said body having at least a thin lightly doped layer adjacent said energy transfer surface and adapted for suppression of the free carrier absorption property, said layer having at least a first end including a first electrical contact proximal to said first end and a second end including a second electrical contact proximal to said second end, said layer being located between said first and second ends, means heating said layer sufficient to produce incandescent emission through said transfer surface, wherein said means heating said layer includes passing electric current through said layer between said first contact and said second contact, wherein said semiconductor body is of a material taken from the group of cubic silicon carbide (3CSiC), hexagonal silicon carbide (αSiC) and aluminum nitride (AlN), and wherein said body is of cubic silicon carbide and wherein said layer is doped to about $10^{17}$ atoms/cc and is about 500–1000 Å thick and is supported by a layer of said silicon carbide doped to about $10^{15}$ atoms/cc.

19. The process of providing an incandescent light conversion member comprising the steps of:

forming a free standing filament of at least one of cubic SiC, hexagonal SiC and AlN, said filament having a layer about 500–1000 Å thick doped to about $10^{17}$ atoms/cc, said layer being supported by a second layer of said cubic SiC about 10 micrometers thick, said second layer having a dissimilar doping characteristic to said first layer, said first layer including a first end and a second end, a first electrical contact being located at said first end of said layer and a second electrical contact being located at said second end of said first layer and, maintaining said filament at temperature greater than 600 degrees C. by passing an electric current through said filament between said first electrical contact and said second electrical contact.

20. The incandescent light emission apparatus of claim 14, where said first layer is doped with nitrogen and wherein said second layer is doped with boron.

21. The incandescent light emission apparatus of claim 18, wherein said semiconductor body is coated with a layer of aluminum nitride (AlN).

22. An apparatus for the conversion of energy between at least one of heat and electricity and incandescent light comprising in combination:

an energy converter body member including a semiconductor body with at least one radiant energy transfer surface and at least one region for the transfer of at least one of heat and electricity, said first region comprising doped 3C-SiC semiconductor material, said region including a first end and a second end, said radiant energy transfer surface located between said first and second ends, said semiconductor energy converter body member having a band gap greater than about 2 eV, said semiconductor energy converter body having at least one layer adjacent to and essentially parallel with said radiant energy transfer surface in which the free carrier absorption property of said semiconductor is suppressed, and, means transferring at least one of heat and electricity at least to said layer adjacent to said energy transfer surface, wherein said means transferring at least one of heat and electricity includes at least one of: (1) electrical contacts in contact with both said first end and said second end of said layer adjacent to said energy transfer surface, and (2) an external heating source for heating said semiconductor body to cause incandescent light to be emitted by said radiant energy emission surface.

23. The apparatus for the conversion of energy between at least one of heat and electricity and incandescent light of claim 22, wherein said at least a first region and said one layer are the same.

24. An incandescent light filament comprising:

an energy converter body member including a body having at least one radiant energy transfer surface, said body including at least a first region for the transfer of at least one of heat and electricity, said first region including at least first and second opposing surfaces, said first surface comprising said at least one radiant energy transfer surface, said first region further comprising doped 3C-SiC semiconductor material, wherein said first region includes third and forth opposing surfaces perpendicular to and extending between said first and second opposing surfaces, and wherein said means for transferring includes ohmic contacts adjacent to at least said third and fourth opposing surfaces, said energy converter body including at least a second region different from said first region and positioned essentially parallel with said at least one radiant energy transfer surface, said semiconductor energy converter body member having a band gap greater than about 2 eV, and, said ohmic contacts for transferring at least one of heat and electricity to said semiconductor body.

25. The incandescent light filament of claim 24, wherein said second layer has a relative thickness greater than the relative thickness of said first region.

26. The incandescent light filament of claim 25, wherein said second layer additionally comprises semiconductor material.

27. The incandescent light filament of claim 26, wherein said first region is grown as an epitaxial layer on top of said second layer.

* * * * *